United States Patent
Vakanas et al.

(10) Patent No.: US 8,173,552 B2
(45) Date of Patent: May 8, 2012

(54) METHOD OF FABRICATING AN IDENTIFICATION MARK UTILIZING A LIQUID FILM ASSISTED BY A LASER

(75) Inventors: George P. Vakanas, Tempe, AZ (US); Sergei L. Voronov, Chandler, AZ (US); Luey Chon Ng, Kulim (MY); George E. Malouf, Anaheim, CA (US)

(73) Assignee: Intel Corporation, Santa Clara, CA (US)

( * ) Notice: Subject to any disclaimer, the term of this patent is extended or adjusted under 35 U.S.C. 154(b) by 258 days.

(21) Appl. No.: 12/462,441

(22) Filed: Aug. 4, 2009

(65) Prior Publication Data

US 2011/0031590 A1 Feb. 10, 2011

(51) Int. Cl.
*H01L 21/31* (2006.01)
*H01L 23/544* (2006.01)
*A61N 5/00* (2006.01)

(52) U.S. Cl. ...... 438/759; 438/940; 257/797; 250/492.2

(58) Field of Classification Search .................. None
See application file for complete search history.

(56) References Cited

U.S. PATENT DOCUMENTS

| 5,958,794 | A * | 9/1999 | Bruxvoort et al. ............ 438/692 |
| 6,733,868 | B1 * | 5/2004 | Kanbe et al. ................ 428/195.1 |
| 7,323,699 | B2 * | 1/2008 | Hopkins et al. ............. 250/492.2 |
| 7,495,240 | B2 * | 2/2009 | Hopkins et al. ............. 250/492.2 |
| 2002/0055238 | A1 * | 5/2002 | Sugino et al. ................ 438/459 |

* cited by examiner

*Primary Examiner* — Alonzo Chambliss

(74) *Attorney, Agent, or Firm* — Kathy J. Ortiz

(57) ABSTRACT

Methods of forming a microelectronic structure are described. Embodiments of those methods include forming a liquid on a region of a die, and then forming an identification mark through the liquid on the die.

13 Claims, 4 Drawing Sheets

METHOD OF FABRICATING AN IDENTIFICATION MARK UTILIZING A LIQUID FILM ASSISTED BY A LASER

BACKGROUND OF THE INVENTION

Microelectronic wafer structures, such as silicon wafer structures, for example, may comprise a plurality of die. Various die identification methods may be used to identify the die, such as ink marking, stamping, laser marking, or embedding radio-frequency identification inside the chip device. Despite potential replacement by radio-frequency identification embedded in the silicon, laser marking variations continue to extend the technical scaling envelope while maintaining cost parity and affordability. Maintaining the mechanical quality, integrity and reliability of thin die (such as die comprising less than 200 microns in thickness) during such a marking process, ensuring readability of the mark by inspection systems and permanency of the mark through the fabrication line, subsequent customer lines and end-use conditions, has become a challenge associated with ultra-thin die in 2D XY-constrained packaging processes enabling USFF (ultra-small form-factor) electronic packages.

BRIEF DESCRIPTION OF THE DRAWINGS

While the specification concludes with claims particularly pointing out and distinctly claiming certain embodiments of the present invention, the advantages of this invention can be more readily ascertained from the following description of the invention when read in conjunction with the accompanying drawings in which:

DETAILED DESCRIPTION OF THE PRESENT INVENTION

Figure 1A:
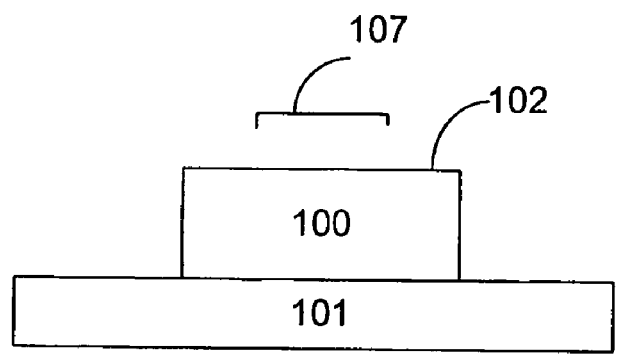
FIGS. 1a-1f represent methods of forming structures according to an embodiment of the present invention.

—In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming a microelectronic structure, such as a marked die structure, are described. Those methods may comprise forming a liquid on a region of a die, and then forming an identification mark through the liquid on the die. Methods of the present invention enable a low stress, water-film-assisted laser technique for marking die with minimal impact to die break strength and which is compatible with various packaging architectures.

FIGS. 1a-1f illustrate embodiments of methods of forming a microelectronic structure, such as a marked die structure, for example. FIG. 1a illustrates a die 100, which may comprise a silicon die, for example. In one embodiment, the die 100 may comprise a packaged die 100, as are known in the art, and may be disposed on a package substrate 101 in an embodiment. The packaged die may further comprise such features as underfill material, epoxy etc. The die 100 may comprise such circuit elements 103 as transistors, resistors, inductors, capacitors, dielectric layers and interconnection structures, such as bonding pads and/or bumps that may be disposed between the substrate 101 and the die 100.

In one embodiment, the die 100 may be any such die that may be associated with a microelectronic device. The die 100 may comprise a back side 102. In one embodiment, the die 100 may comprise a thickness of less than about 200 micron, and in another embodiment, the die may comprise a thickness of about 75 microns or less. The die 100 may comprise a region 107. The region 107 may be a location wherein an identification mark may be subsequently placed according to the various embodiments of the present invention described herein.

Figure 1B:
Figure 1B:
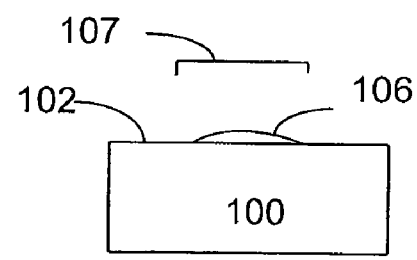

The placement/location of the region 107 on the die 100 may vary depending upon the particular application. In some cases, the region 107 may be located on the backside 102 of the die 100 and may be located in a middle portion of the die 100. In an embodiment, a liquid 106 may be dispensed in/on the region 107 of the die 100 (FIG. 1b). In an embodiment, the liquid may comprise a liquid film. In an embodiment, the liquid 106 may comprise a water droplet, and may be dispensed using a dispensing tool 108 that may be located/integrated within a laser marking tool, or even within the laser-head fiber placer subcomponent. In other embodiments, the liquid 106 may comprise any suitable liquid according to the particular application, and may be dispensed in a tool 108 that may be located independently from such a laser marking tool.

In an embodiment, the region 107 may comprise a central portion of the backside 102 of the die 100. In an embodiment, the liquid 106 may be dispensed on the region 107 of the die 100 while the packaged die 100 is located within a laser marking tool. Performing the dispensing of the liquid 106 within such a laser marking tool/process serves to avoid shifting of the liquid droplet 106 and moisture exposure of any epoxy and/or substrate of the packaged die 100 in some cases.

In an embodiment, an independent dispense head may be integrated into the laser mark tool to dispense the liquid on the die 100 center of packaged die as they are held in a carrier media (not shown). In an embodiment, when the die 100 comprises a hydrophilic surface, such as but not limited to a silicon hydrophilic die 100 surface, the water droplet 106 will wet the hydrophilic surface of the die 100. A fairly flat liquid-air interface will be generated which enables a liquid-film-assisted low heat affected zone (HAZ) on the die 100 and enables a low-stress and low debris precipitation laser marking process. In an embodiment, the HAZ may comprise a portion of the region 107. The liquid/silicon contact angle may be about 40° in some cases. In embodiments, wetting of the hydrophilic surface can be improved by surface modification, such as by utilizing plasma processing, etching solutions, smooth rough back-side grinding (sBSG) vs rough back-side grinding (rBSG) and other such methods according to the particular application.

Figure 1C:
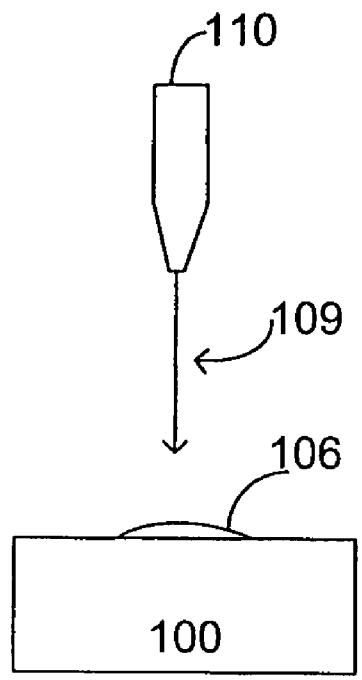
Figure 1D:
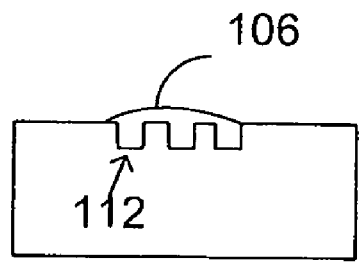

The die 100 may undergo an identification marking process by using a laser marking process 109, such as by using a laser marking tool 110, for example, wherein an identification mark 112 may be formed (FIG. 1c-FIG. 1d). In an embodiment, the die 100 may be placed/located within the laser marking tool 110. In an embodiment, the identification mark may comprise a human and machine readable unit-level traceability (ULT) mark. The liquid 106 may serve to acting as a coolant during the laser-based marking process, such as but not limited to a laser-based rapid thermal processing (RTP), resulting in partial absorption and dissipation of the laser energy.

In an embodiment, penetration of the laser beam through the liquid 106 may be at a normal direction to the die 100 in order to avoid refraction in the liquid and total internal reflection. Laser ablated debris that may be formed during the laser marking process 109 will be suspended within the liquid 106. Use of the liquid 106 during the laser process 109 may result in tighter control of the HAZ, less internal damage/stress to bulk silicon of the die 100 and thus less die break strength degradation.

Low-stress laser marking on the die 100, such as a silicon die 100, enables smaller package sizes, USFF (ultra-small form-factors) and ensures low-stress die impact and non-detectable die cracking due to laser marking. Die crack can be a major issue in assembly processing across products and packages (particularly for USFF, thin-die, mobile, desktop and server applications) and may result in both yield fallouts as well as in excursion failures.

Prior art die level laser back side marking processes typically degrade die break strength, results in die cracking, thus impacting yield and reliability. Ink marking encounters ink permanency and mark resolution issues. Surface preparation/modification techniques tend not to be cost effective and introduce several additional process steps. The embodiments of the present invention provide a die level back side laser mark solution which introduces less die damage during laser marking and leads to higher yields. Aggressive die thickness scaling of less than about 75 microns requires control of die degradation in order to maintain and increase yield targets and package reliability.

Figure 1E:
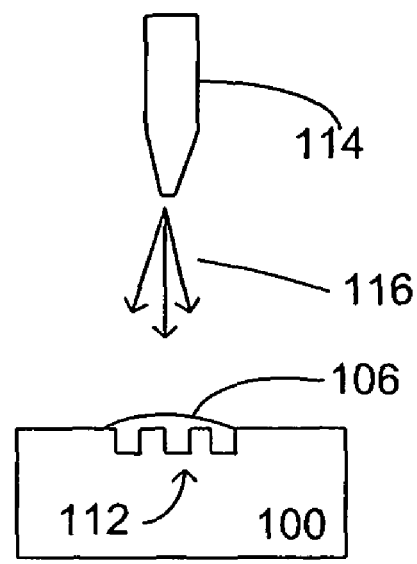
Figure 1F:
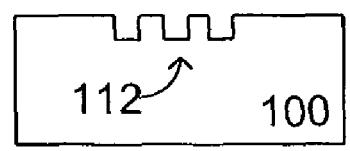

After the laser marking process, the liquid 106 may be removed from the die 100 by undergoing a removal process 116 (FIG. 1e-FIG. 1f). In an embodiment, the liquid 106 may be removed by using a dispensing tool 114, which may be integrated into the liquid dispensing tool 108 in some cases. In some embodiments, the liquid 106 may be removed by a wiping, cleaning and/or blowing mechanism. In an embodiment, the liquid 106 may be wiped or blown off from the die 100 surface using air or nitrogen, for example, by utilizing the dispense head (which in some cases may be integrated in the laser marking tool) to prevent moisture exposure of the underfill and substrate of the die package and avoid the need for further processing (e.g. pre-bake steps and downstream laser mark processing, for example).

Figure 2A:
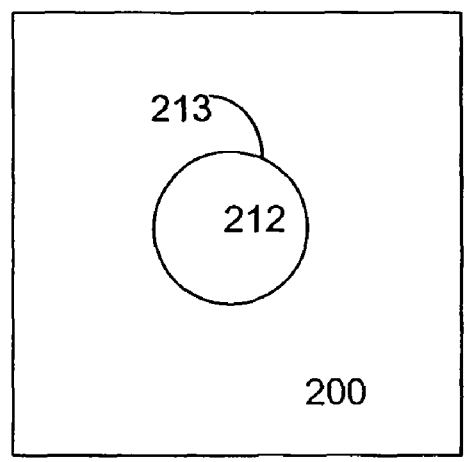
FIG. 2a represents a structure according to an embodiment of the present invention.
Figure 2B:
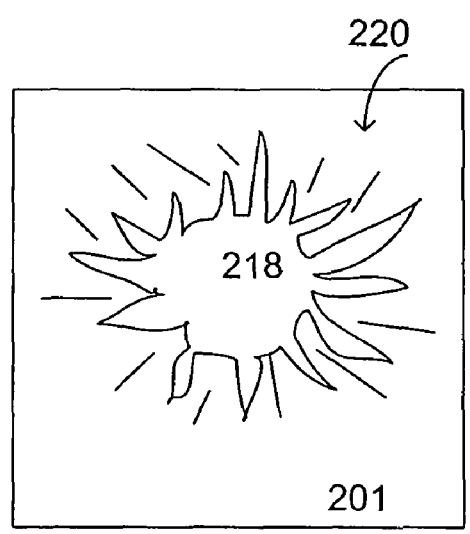
FIG. 2b represents a structure from the Prior Art.

Laser ablated debris formed during the laser marking process and suspended within the liquid will be washed away during the removal process 116 (FIG. 1f). Prior art die marking processes that do not utilize liquid assisted laser marking according to the various embodiments of the present invention may result in a splatter pattern 220 around/surrounding the die identification mark 218 of the die 201 (FIG. 2b). The splatter pattern may be formed in an XY direction and may comprise a ridge topography in the Z/height direction as well. The splatter pattern may comprise silicon defects generated by the non-liquid assisted prior art laser marking process, which tend to exacerbate damage and cracking during force-loading, socketing and/or subsequent testing. The embodiments of the present invention result in a non-splattered pattern 213 surrounding the identification mark 212 of the die 200 (FIG. 2a), because little to no defect generation is caused by the liquid assisted laser marking process.

Maintaining the mechanical quality, integrity and reliability of thin die has become one of the major challenges associated with packaging. For less than about 200 microns in die thickness (depending on the structural composition of the silicon stack), die level based backside laser marking has been shown to cause about a twenty percent degradation in die break strength, thus reducing the mechanical integrity, quality of the die. Methods of the various embodiments enable reliable thin-die laser marking of a human readable mark and a machine-readable code using standard infrared, green and UV wavelengths.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that various microelectronic structures are well known in the art. Therefore, the Figures provided herein illustrate only portions of an exemplary microelectronic structure that pertains to the practice of the present invention. Thus the present invention is not limited to the structures described herein.

What is claimed is:

1. A method comprising:
   forming a liquid on a region of a die; and
   forming an identification mark through the liquid on the die using a laser marking tool; and
   removing the liquid from the region of the die with a dispense head that is integrated in the laser mark tool.

2. The method of claim 1 further comprising wherein the identification mark is formed by utilizing a laser process.

3. The method of claim 1 further comprising wherein the identification mark does not comprise a splatter region surrounding the identification mark.

4. The method of claim 1 further comprising wherein the liquid comprises water.

5. The method of claim 1 further comprising removing the liquid from the die by at least one of a wipe out and blow off process.

6. The method of claim 5 wherein the die comprises a thickness of less than about 75 microns.

7. The method of claim 1 wherein the liquid is formed by using a dispense tool integrated with a laser tool.

8. The method of claim 1 further comprising wherein debris formed during the formation of the identification mark is suspended within the liquid.

9. A method comprising:
   dispensing a liquid droplet on a middle portion of a backside of a packaged silicon die;
   forming an identification mark on the packaged silicon die through the liquid using a laser marking tool;
   removing the liquid droplet from the backside of the packaged silicon die surface; and
   removing the liquid droplet from the backside of the packaged silicon die surface with a dispense head that is integrated in the laser marking tool.

10. The method of claim 9 further comprising wherein laser ablating debris formed during laser marking is suspended within the liquid.

11. The method of claim 10 wherein removing the liquid droplet substantially removes the debris.

12. The method of claim 9 wherein penetration of the laser beam through the liquid film occurs at a normal direction to the die.

13. The method of claim 9 wherein the packaged silicon die is located within the laser marking tool.

* * * * *